United States Patent [19]

McDermott et al.

[11] Patent Number: 5,294,261

[45] Date of Patent: *Mar. 15, 1994

[54] SURFACE CLEANING USING AN ARGON OR NITROGEN AEROSOL

[75] Inventors: Wayne T. McDermott, Allentown; Richard C. Ockovic, Northampton, both of Pa.; Jin J. Wu, Ossining; Douglas W. Cooper, Milwood, both of N.Y.; Alexander Schwarz, Bethlehem, Pa.; Henry L. Wolfe, Pleasant Valley, N.Y.

[73] Assignees: Air Products and Chemicals, Inc., Allentown, Pa.; International Business Machines Corporation, Hopewell Junction, N.Y.

[*] Notice: The portion of the term of this patent subsequent to Nov. 5, 2008 has been disclaimed.

[21] Appl. No.: 970,346

[22] Filed: Nov. 2, 1992

[51] Int. Cl.⁵ .............................................. B08B 5/00
[52] U.S. Cl. ....................................................... 134/7
[58] Field of Search ............................................ 134/7

[56] References Cited

U.S. PATENT DOCUMENTS

| | | | |
|---|---|---|---|
| 4,806,171 | 2/1989 | Whitlock et al. | 134/7 |
| 5,062,898 | 11/1991 | McDermott et al. | 134/7 |

FOREIGN PATENT DOCUMENTS 0332356 9/1989 European Pat. Off. .
2146926 5/1985 United Kingdom .

OTHER PUBLICATIONS

Airco Special Gases "Spectra-Clean ® $CO_2$" brochure Jul. 1, 1987.
*Chemical Processing;* Nov. 1989; p. 54.
*Semi-conductor International;* Nov. 1989; p. 16; Mitsubishis LSI Research and Development Laboratory.
Abstract No. 377; "Ultra Clean Ice Scrubber with Jetting Fine Ice Particles"; Ohmuri, et al., Aug., 1989.
Hoenig, et al; "Cleaning Surfaces with Dry Ice"; *Compressed Air Magazine;* Aug. 1986; pp. 22-24.
Hoenig, et al; "Control of Particulate Contamination by Thermophoresis . . . "; *Ninth ICCC8 Processed 1988;* Inst. of Env. Sci.; pp. 671-678.

*Primary Examiner*—R. Bruce Breneman
*Assistant Examiner*—Thomas G. Dunn, Jr.
*Attorney, Agent, or Firm*—Geoffrey L. Chase; James C. Simmons; William F. Marsh

[57] ABSTRACT

A method is disclosed for cleaning microelectronic surfaces using an aerosol of at least substantially solid argon or nitrogen particles which impinge upon the surface to be cleaned and then evaporate and the resulting gas is removed by venting along with the contaminants dislodged by the cleaning method.

17 Claims, 1 Drawing Sheet

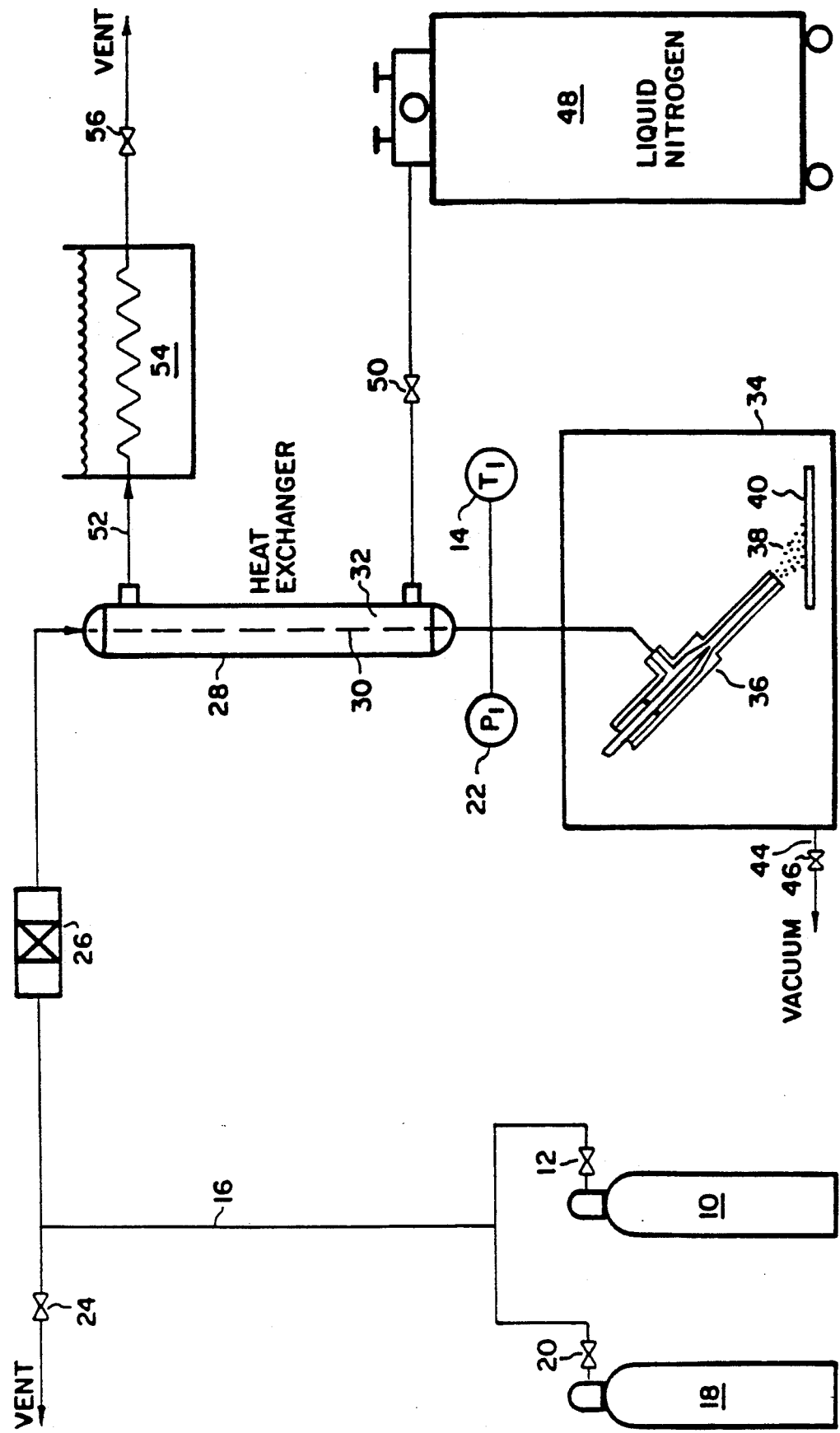

SURFACE CLEANING USING AN ARGON OR NITROGEN AEROSOL

FIELD OF THE INVENTION

The present invention is directed to the field of cleaning particulates from contamination sensitive surfaces using an impinging stream of an aerosol containing at least substantially solid argon or nitrogen particles. More particularly, the present invention is directed to cleaning particles and films from sensitive microelectronic surfaces by impinging a stream of an aerosol of solid argon or nitrogen particles against such surfaces to displace the particles and/or film and remove the by-products by venting.

BACKGROUND OF THE PRIOR ART

Small quantities of contamination are detrimental to the microchip fabrication process. Contamination in the form of particulates, films or molecules causes short circuits, open circuits, silicon crystal stacking faults, and other defects. These defects can cause the finished microelectronic circuit to fail. Such failures are responsible for significant yield reductions in the microelectronics industry. Yield reductions caused by microcontamination substantially increase processing costs.

Microelectronic circuits require many processing steps. Processing is performed under extremely clean conditions. However, the amount of contamination needed to produce fatal defects in microcircuits is extremely small. For example, an individual particle as small as 100 Angstroms in diameter can result in a killer defect in a modern microcircuit. Microcontamination may occur at any time during the many steps needed to complete the circuit. Therefore, periodic cleaning of the wafers used for microelectronic circuits is needed to maintain economical production yields. Also, tight control of purity and cleanliness in the processing gas is required.

Future microcircuits will have smaller feature sizes and greater complexities, and will require more processing steps. Therefore, in order to maintain economical yields, contamination control techniques in the process gas system and processing environment must be significantly improved and an improved wafer cleaning procedure must be developed.

Several methods are presently used to clean surfaces for the electronics industry. Solvent or chemical cleaning is used to remove contaminant films from surfaces. Since solvents are selective in the materials they can dissolve, an appropriate solvent must be chosen to remove the contamination. Chemical solutions can be combined with Megasonic or Ultrasonic cleaners. These devices impart high energy sonic waves to the surface which can remove organic films, ionic impurities and particles as small as 3000 Angstroms. However, solvent or chemical cleaning requires extremely pure and clean agents. High purity and cleanliness is difficult and/or expensive to achieve in liquid agents. In addition, the agent becomes progressively more contaminated as it is used and must be disposed of periodically. Failure to change the agent periodically causes redeposition of contaminants, which reduces the effectiveness of the cleaning process. Disposal of such agents frequently results in environmental damage. Also, such agents require special safety procedures during handling in order to minimize exposure to operators.

Gas jet cleaning and liquid spray cleaning are presently used to clean relatively large particles from silicon wafers. Gas jets, (e.g., filtered nitrogen jets) are ineffective in removing particles smaller than about 50,000 Angstroms. Smaller particles are more difficult to remove. This is because the adhesive force tending to hold the particle to the surface is proportional to the particle diameter while the aerodynamic drag force by the gas tending to remove the particle is proportional to the diameter squared. Therefore, the ratio of these forces tends to favor adhesion as the particle size shrinks. Also, smaller particles are not exposed to strong drag forces in the jet since they can lie within the surface boundary layer where the gas velocity is low. Liquid jets provide stronger shear forces to remove particles but are expensive and/or difficult to obtain at high purity and may leave contaminating residues after drying. Also, a common liquid spray solvent (Freon TF) is environmentally damaging.

Exposure to ozone combined with ultraviolet light can be used to decompose contaminating hydrocarbons from surfaces. However, this technique has not been shown to remove contaminating particles.

A recently developed cleaning technique involves the use of a carbon dioxide aerosol to "sandblast" contaminated surfaces. Pressurized gaseous carbon dioxide is expanded in a nozzle. The expansion drops the carbon dioxide pressure to atmospheric pressure. The resulting Joule-Thompson cooling forms solid carbon dioxide particles which traverse the surface boundary layer and strike the contaminated surface. In some cases the carbon dioxide forms a soft material which can flow over the surface, displacing particles without leaving a residue. The technique requires extremely clean and pure carbon dioxide. Trace molecular contaminants (eg., hydrocarbons) in the feed gas can condense into solid particulates or droplets upon expansion, causing deposition of new contaminants on the surface. Carbon dioxide is difficult and/or expensive to provide in ultrahigh purity, i.e., with less than parts per million levels of trace impurities. Because of this problem, the carbon dioxide cleaning technique has not yet been shown to be effective in ultraclean (eg., silicon wafer) applications.

The technique of utilizing solid carbon dioxide to remove particulates from a surface is set forth in U.S. Pat. No. 4,806,171.

European Published Application 0 332 356 discloses a cleaning technique using carbon dioxide wherein the purity of the carbon dioxide is enhanced by first vaporizing liquid carbon dioxide, filtering the resulting gas and reliquefying the gas for use as a cleaning agent in the form of dry ice snow.

UK Published Application 2 146 926 A describes a carbon dioxide cleaning media comprising formed solid carbon dioxide, an overlayer of water ice and an entraining jet of compressed air. This technique complicates the possible sources of contamination for a cleaning media which is required to provide high purity cleaning without recontaminating the surface being treated with materials carried in the cleaning media.

Equipment for attempting cleaning with carbon dioxide is described in a brochure from Airco Special Gases titled "Spectra-CleanT $CO_2$". The system comprises a submicron filter and conduit attached to a carbon dioxide pressurized gas cylinder with several stages of pressure reduction to provide a directed stream of carbon dioxide snow for cleaning purposes.

An article in *Chemical Processing*, November 1989, page 54 identifies that a dry ice "Carbon dioxide" system is available for cleaning from Liquid Carbonic identified as a COLD JET* CLEANING SYSTEM.

In an article contained in *Semiconductor International*, November 1989, page 16 Mitsubishi's LSI Research and Development Laboratory reports the use of water ice to clean semiconductor wafers. See also Abstract No. 377 titled "Ultraclean Ice Scrubber Cleaning with Jetting Fine Ice Particles" by T. Ohmori, T. Fukumoto, an T. Kato.

An article by Stuart A. Hoenig, "Cleaning Surfaces with Dry Ice" appearing in Compressed Air Magazine, August 1986, pages 22 through 24 describes a device for using carbon dioxide snow in mixture with dry nitrogen gas as a cleaning agent for appropriate surface cleaning.

A dry ice technique is also disclosed by Stuart A. Hoenig, et al. in the article "Control of Particulate Contamination by Thermophoresis, Electrostatics and Dry Ice Techniques" appearing in the Ninth ICCCS Proceedings 1988 Institute of Environmental Sciences, page 671 through 678. The article described various techniques for reduction of contamination in semiconductor and electronic materials. The use of a stream of dry ice particles is also critiqued.

Despite the attempts at providing the thoroughness of cleaning necessary for microelectronic fabrications and materials, the prior art systems predicated upon liquid solvents, carbon dioxide or water-based cleaners suffer from the disadvantage that these substances themselves are considered to be impurities in the microchip fabrication process. For example, present purity specifications for bulk nitrogen shipped to electronics manufacturers permits no more than about 10 parts per billion carbon dioxide and no more than about 50 parts per billion water. When carbon dioxide or water are used as cleaning agents, a significant amount of these substances will remain on the surface as adsorbed contaminants. Many wafer processing steps such as annealing and dopant diffusion are performed at high temperatures and are affected by the presence of reactive contaminants. For example, trace amounts of carbon dioxide may decompose during high temperature processing steps and leave deposited carbon on the silicon wafer surface. The carbon will significantly affect the electrical properties of the finished microcircuit.

Carbon dioxide as a cleaning agent is prone to contamination in excess of the requirements of the microelectronic circuit fabricating industry. Carbon dioxide is typically produced by oxidizing natural gas. Considerable levels of impurities remain in the product of this reaction including many unreacted components of the natural gas and byproducts of the reaction. Carbon dioxide may be further purified through adsorption of impurities on molecular sieves, but purity levels better than parts per million are difficult to achieve. Purification through distillation is not practical since typical impurities, such as hydrocarbons, have molecular weights and boiling points near that of carbon dioxide and therefore cannot be separated efficiently. Carbon dioxide can be sold as a gas or liquid, but must be compressed using lubricated pumps. This increases the contamination level of the carbon dioxide. Finally, liquid carbon dioxide is a strong solvent for hydrocarbon lubricants. Therefore it tends to pick these materials up and become more contaminated during transport to the point of use.

The intrinsically higher contamination level of carbon dioxide, especially with regard to hydrocarbons, results in an unacceptable deposit of condensed, oily droplets on the surface of the microelectronic device to be cleaned. The droplets render the carbon dioxide cleaner unacceptable for microelectronic applications. Efforts have attempted to improve the purity level of carbon dioxide feed gas for such cleaning utilities.

It is also known that water ice-based cleaners have been found to cause damage specifically pits to substrates treated during the cleaning process with the particulate water-ice.

U.S. Pat. 5,062,898 discloses the use of gaseous argon to supply the cryogen for the production of solid argon aerosol for cleaning.

The present invention overcomes the drawbacks of the prior art by providing a highly pure and inert particulate aerosol for cleaning substrates and other surfaces to a level of cleanliness required by the microelectronics industry, while avoiding re-contamination by the particles of the cleaning aerosol themselves. This advance in such cleaning as well as other advantages and distinctions will be demonstrated more particularly by the disclosure of the present invention which follows.

BRIEF SUMMARY OF THE INVENTION

The present invention is directed to a method for removing contaminating particles and/or films from a particle and/or film-containing surface using an impinging stream of an at least substantially solid argon or nitrogen particle-containing aerosol, comprising: expanding a pressurized liquid argon or gaseous and/or liquid nitrogen-containing stream, which is at a temperature at the existing stream pressure prior to expansion so as to form at least substantially solid particles of argon or nitrogen in the stream by the cooling resulting from the expansion to form an at least substantially solid argon or nitrogen particle-containing aerosol, and directing the aerosol at the surface to remove said contaminating particles and/or film.

Preferably, in the case of argon aerosol, the present invention includes a nitrogen carrier gas with the argon-containing stream which nitrogen carrier gas remains in the gaseous state after the expansion so as to form an aerosol of at least substantially solid argon particles in a nitrogen carrier gas.

Preferably, the expansion of the argon or nitrogen-containing stream is conducted into a zone maintained at pressures ranging from high vacuum to greater than atmospheric.

Preferably, the gaseous nitrogen-containing stream is precooled to a temperature near its liquefaction point to condense out condensable impurities in the stream prior to the expansion, and the impurities are separated from the stream. Specifically, the impurities may include water carbon dioxide and hydrocarbons.

Preferably, the pressurized argon or nitrogen-containing stream is at a pressure in the range of approximately 20 to 690 psig, more preferably approximately 20 to 100 psig.

Preferably, an acute angle is formed by the plane of the surface to be cleaned and the direction of the aerosol impinging the surface.

Preferably after removal of the contaminating particles and/or film, the surface is warmed above the liquefaction temperature of argon or nitrogen at the existing pressure. Optimally, the surface is warmed above the liquefaction temperature of water at the existing pressure.

Preferably, the surface may include among others: the inside surface of gas distribution system components such as pipes, valves and conduits, microelectronic processing equipment such as furnaces and plasma chambers, as well as silicon wafers and microelectronic components.

Preferably, in the case of argon aerosol where the argon is mixed with nitrogen, the argon to nitrogen ratio is in the range of approximately 10% to 100% argon with the remainder being nitrogen by volume.

Preferably, the precooling is performed to a temperature in the range of approximately $-190°$ F. to $-340°$ F.

Preferably, the acute angle of impingement of the at least substantially solid argon or nitrogen particle containing stream with the surface to be cleaned is approximately $45°$.

Preferably, contaminating particles on the surface are smaller than 10,000 angstroms.

In a preferred embodiment, the present invention is a method for removing contaminating particles and/or films from a particle and/or film-containing surface using an impinging aerosol stream of solid nitrogen particles comprising, precooling gaseous nitrogen to a temperature sufficient to condense out condensable impurities, separating the condensable impurities from the nitrogen, rapidly expanding the nitrogen from a pressure in the range of approximately 20 to 100 psig to a lower pressure condition, at a temperature so as to form solid particles of nitrogen by the cooling resulting from the expansion to produce the aerosol stream, and directing the aerosol stream at the surface to remove the contaminating particles and/or film.

BRIEF DESCRIPTION OF THE DRAWING

The drawing is a schematic representation of a preferred embodiment of the present invention.

DETAILED DESCRIPTION OF THE INVENTION

The present invention uses an at least substantially solid argon or nitrogen particle-containing aerosol to "sandblast" contaminated surfaces. Argon and nitrogen are inert substances which are not harmful to silicon wafers or microcircuits. Argon and nitrogen can be produced in ultrahigh purity economically. In the case of argon aerosol, the argon can be used alone or mixed with ultrapure nitrogen in the present invention. In this case, the nitrogen remains in the gaseous phase and serves as a carrier medium to impart high velocities to the argon particles. The addition of nitrogen to the argon aerosol also permits higher expansion ratios which enhances the Joule-Thompson effect and permits increased cooling. The mixture ratio of argon to nitrogen may range from approximately 10% to 100% argon by volume.

The previously purified argon or nitrogen is first filtered free of any remaining contaminating particles and preferably precooled for example in a heat exchanger. The argon or nitrogen may remain in the gaseous phase following the precooling operation. Precooling also permits partial condensation and removal of any remaining trace impurities onto the heat exchanger walls. Precooling may be combined with simultaneous removal of trace impurities using a molecular sieve or catalytic impurities removal device or an impurities getter located upstream of the heat exchanger. Such methods for removing trace molecular impurities from inert gases are well known in the field. The pressure of the precooled cryogen is typically held in the range of 20 psig to 690 psig, preferably 20 psig to 100 psig. The temperature of the precooled cryogen is typically in the range $-190°$ F. to $-340°$ F. for the first pressure range above and $-250°$ F. to $-340°$ F. for the second pressure range above.

The precooled cryogen is then expanded in a nozzle or expansion valve to a lower pressure. The pressure of the expanded cryogen may range from high vacuum to greater than atmospheric pressure. The resulting Joule-Thompson cooling serves to solidify argon or nitrogen particles. For the purpose of this invention, the argon or nitrogen may form liquid particles as well as solid particles and still be efficacious for cleaning. It is preferred to form solid particles, but if at least a substantial portion of the argon or nitrogen particles are solid, the cleaning process is significantly improved over prior techniques. Argon or nitrogen particles may condense through a process of homogeneous nucleation. The resulting cryogenic aerosol is then directed at an inclined angle (typically $45°$) toward a contaminated surface to be cleaned. The jet is typically at a vertical distance of approximately 1/16 "to several inches above the contaminated surface. The gas mixture is expanded through a nozzle. The nozzle geometry may vary. The present invention has been shown to be effective for circular nozzles and slit nozzles. Slit nozzles are well suited for broad surfaces such as silicon wafers. Circular nozzles are well suited for more localized cleaning applications. Complete removal of surface contaminants is typically achieved within several seconds of exposure to the aerosol.

The argon cleaning technique has been shown to provide effective cleaning of silicon wafers. Examples of gaseous cleaning jets demonstrate that 0.624 micrometer (6240 Angstrom) particles are not removed using conventional nitrogen gas jet cleaning techniques. However, the same particles are completely removed using the argon aerosol cleaning technique (approximately 100% effectiveness). The argon cleaner has also been shown to be effective in removing 1000 Angstrom-size particles from bare silicon wafers and thick films of bearing grease from glass surfaces. In the context of the present invention, the term particles includes particles at the molecular size level.

Cleaning of contaminated surfaces is accomplished in this invention through a process of colliding argon or nitrogen particles at high velocity against the surface to be cleaned. The argon or nitrogen particles strike contaminating particles, films and molecules located on the surface. The collision imparts sufficient energy to the contamination to release it from the surface. The released contamination becomes entrained in the gas flow and is vented. The gaseous phase of the aerosol impinges against the surface and flows across it, forming a thin boundary layer. The dimensions of the contaminating material (particles, films, etc.) are typically so small that they exist completely within the low velocity boundary layer. Therefore, the gas phase alone cannot remove small contamination because of insufficient shearing force. However, the argon or nitrogen particles have significant inertia and are thus able to cross through the boundary layer to the surface.

The argon or nitrogen particles tend to decelerate as they pass through the boundary layer toward the surface. In order for cleaning to occur, the argon or nitrogen particles must traverse the boundary layer and strike the surface. A simple model assumes that the gas flow creates a boundary layer of thickness "h" having a negligible normal component of velocity. In order to strike the surface, the solidified argon or nitrogen particles must enter the boundary layer with a normal component of velocity equal to at least "h/t". The particle relaxation time "t" is given by:

$$T = 2 a^2 P_p C/9m \quad (1)$$

where "a" is the argon or nitrogen particle radius, "Pp" is the particle density, "m" is the dynamic viscosity of the gas and "C" is the Stokes-Cunningham slip correction factor which is given by:

$$C = 1 + 1.246 (g/a) + 0.42 (g/a) \exp[-0.87 (g/a)] \quad (2)$$

"g" is the mean free path of the gas molecules which is inversely proportional to the gas pressure.

The above analysis demonstrates that the cleaning process is most effective for argon or nitrogen particles having large mass or high initial velocity. The cleaning process is also enhanced at lower pressures due to the increased particle slip and at lower gas viscosities due to the decreased decelerating drag force on the argon or nitrogen particles.

The argon or nitrogen particles are formed during the expansion process. The temperature drop associated with the expansion causes argon or nitrogen to nucleate and condense and/or solidify into at least substantially solid particles. Solid argon or nitrogen particles will form directly from the liquid argon or gaseous and/or liquid nitrogen if the pressure of the expanded mixture is lower than the argon or nitrogen triple point. If the pressure of the mixture is higher than the triple point the argon or nitrogen will first condense into liquid droplets before freezing into solid particles. The triple point of argon is at 9.99 psia, −308.9° F. The triple point of nitrogen is at 1.82 psia, −345.9° F.

The present invention will now be described in greater detail with reference to the drawing. In the drawing, liquid argon or gaseous and/or liquid nitrogen available in highly purified form from cryogenic distillation of air is provided, for example, in a typical industrial gas cylinder 10 prepped for high purity. Alternatively, the argon or nitrogen is supplied from a liquid storage tank or a gas pipeline. The argon or nitrogen is metered through valve 12. In the case of argon aerosol, the argon is mixed with nitrogen 18 also supplied from cryogenic air separation and stored in an industrial gas cylinder prepped for high purity duty. Alternatively, the nitrogen is supplied from a liquid storage tank or a gas pipeline. This nitrogen flows through valve 20. In this case, the argon and nitrogen are mixed in manifold 16 in the range of 100% up to 100% argon in comparison to nitrogen by volume. During periods of shutdown or repair on the downstream system, gas can be vented through valve 24, but in normal operation the argon or nitrogen mixture is passed through a filter 26 which is designed to trap submicron particles and offer additional cleaning of the high purity argon or nitrogen. Other inline cleaning devices may also be used such as adsorbent beds, catalytic purifiers or getters. The pressurized argon or nitrogen-containing stream is next precooled to a temperature near its liquefaction point at its pressurized condition in indirect-heat exchanger 28 in order to condense out remaining condensable impurities and separate such condensed impurities by adherence to the inside surfaces or walls of the passageways 30 of the heat exchanger 28 through which the argon or nitrogen-containing stream passes. The cooling effect for the argon or nitrogen-containing stream is provided, for example, by cryogenic liquid nitrogen supplied in containment 48 and metered through valve 50 which enters the heat exchanger 28 through alternate passageways 32 which have an indirect heat exchange relationship with passageways 30. Rewarmed nitrogen is removed from the heat exchanger in line 52 further warmed in a water bath 54 and passed through valve 56 to vent to atmosphere. Alternatively, precooling can be achieved by other means such as a closed cycle cryogenic cooler or a recuperative heat exchanger using the argon/nitrogen gas vented after cleaning duty, or precooling may not be necessary if the argon and/or nitrogen is already sufficiently cool, such as if it is supplied from a cryogenic liquid source. The precooled argon or nitrogen-containing stream is rapidly expanded from a pressure in the range of approximately 20 to 690 psig, preferably 20 to 100 psig (monitored by pressure gauge 22) and a temperature (monitored by temperature gauge 14) to form at least substantially solid particles of argon or nitrogen in admixture with either argon or nitrogen which results in an at least substantially solid argon or nitrogen particle-containing aerosol. These at least substantially solid argon or nitrogen particles are formed by the cooling resulting from the expansion, taking advantage of the Joule-Thompson effect. This expansion is performed in an expansion nozzle 36 comprising a variably adjustable reduced diameter orifice and a throat which directs the at least substantially solid argon or nitrogen particle-containing aerosol 38 to a contaminated surface 40 to be cleaned in an ultra-clean process chamber 34 which may be under vacuum conditions provided through line 44 and valve 46 connected to appropriate vacuum inducing means such as a vacuum pump, etc. The aim of the nozzle 36 and the resulting stream 38 against the surface to be cleaned 40 is preferably at an acute angle to the plane of the surface as determined by the vector of the flow of the aerosol stream. Preferably this angle is approximately 45°. The surface 40 has a tendency to be cooled by the at least substantially solid argon or nitrogen which is not a problem in chamber 34. However, it is appropriate to heat the surface to ambient conditions by a heater (not shown) before removing the surface 40 from the chamber 34.

The argon or nitrogen surface cleaner of the present invention differs significantly from the prior art carbon dioxide surface cleaner. The argon or nitrogen surface cleaner uses cleaning agents which are intrinsically purer than carbon dioxide. Argon and nitrogen are inert and therefore less harmful to the microchip fabrication process than carbon dioxide. The argon or nitrogen surface cleaner preferably uses argon or nitrogen to generate a cleaning aerosol. The carbon dioxide cleaner uses carbon dioxide which, in some instances, may be considered a contaminant. The argon or nitrogen surface cleaner operates at substantially lower temperatures than the carbon dioxide cleaner. The argon or nitrogen cleaner uses precooling before the expansion is performed; the carbon dioxide cleaner does not precool the carbon dioxide prior to expansion. The precooling operation assists in the removal of remaining trace molecular impurities in the argon and nitrogen through a process of condensation on the heat exchanger surface. Removal of trace impurities prevents recontamination of the cleaned surface by condensed impurities particles.

The argon or nitrogen surface cleaner affords many advantages over other types of commonly used surface cleaners. The argon or nitrogen cleaning technique leaves no residue, is environmentally compatible and uses ultrapure cleaning agents (argon and nitrogen) which are commonly available in microchip processing facilities. Argon and nitrogen are also lower in cost than many other cleaning agents. The argon or nitrogen cleaning process has been shown to provide approximately 100% removal of submicrometer particles (particles smaller than 10,000 Angstroms) and can remove larger particles also. Other cleaning techniques are either ineffective or less than 100% effective in removing submicrometer contamination. Gases can be filtered to a very high level of cleanliness while liquids typically have relatively high levels of entrained particulate contamination. Therefore, the argon or nitrogen cleaning process uses a considerably cleaner agent than, for example, spray jet or solvent cleaning. Also, since the argon and nitrogen are continuously vented during operation, the process does not suffer from progressive contamination of the cleaning agents as occurs, for example, in solvent or chemical cleaning. The argon or nitrogen cleaning process can operate under vacuum conditions. This makes the process well adapted to future microchip processing techniques which will be performed largely under vacuum conditions. Argon and nitrogen have higher vapor pressures than carbon dioxide under comparable temperature conditions. Therefore, argon and nitrogen can be more easily pumped out of vacuum systems. This makes argon and nitrogen better suited to future microchip processing operations. Since the argon or nitrogen cleaning process is performed in an inert ultrapure atmosphere, recontamination of the surface by molecular impurities after cleaning is completed can be more easily prevented. The argon and nitrogen can be immediately vented to atmosphere after rewarming; no cleanup or conditioning of the vent gas is required. Argon and nitrogen are asphyxiants but are nontoxic and nonflammable. Therefore, the argon or nitrogen cleaning process is inherently safer than most currently used cleaning processes. The argon or nitrogen cleaning process provides flexibility in cleaning intensity. For example, the aerosol intensity can be reduced to permit cleaning without damage to delicate surface features.

The present invention has been set forth with reference to several preferred aspects and embodiments which are utilized for illustrative purposes, however the full scope of the present invention should be ascertained from the claims which follow.

We claim:

1. A method for removing contaminating particles and/or films from a particle and/or film-containing surface using an impinging stream of an at least substantially solid argon or nitrogen particle-containing aerosol, comprising: expanding a pressurized liquid argon or gaseous and/or liquid nitrogen-containing stream, which is at a temperature at the existing stream pressure prior to expansion so as to form at least substantially solid particles of argon or nitrogen in said stream by the cooling resulting from said expansion to form an at least substantially solid argon or nitrogen particle-containing aerosol, and directing said aerosol at said surface to remove said contaminating particles and/or film.

2. The method of claim 1 wherein said argon-containing stream includes a nitrogen carrier gas which remains in the gaseous state after said expansion to form an aerosol of at least substantially solid argon particles in a nitrogen carrier gas.

3. The method of claim 2 wherein the argon to nitrogen ratio is in the range of approximately 10% to 100% argon, with the remainder, if any, nitrogen by volume.

4. The method of claim 1 wherein said expansion of said argon or nitrogen-containing stream is conducted into a zone maintained at pressures ranging from vacuum to greater than atmospheric.

5. The method of claim 1 wherein said gaseous nitrogen-containing stream is precooled to a temperature near the liquefaction point to condense out condensable impurities in said stream prior to said expansion and said impurities are separated from said stream.

6. The method of claim 5 wherein said impurities include water, carbon dioxide and hydrocarbons.

7. The method of claim 5 wherein said pressurized argon or nitrogen-containing stream is at a pressure in the range of approximately 20 psig to 690 psig.

8. The method of claim 7 wherein said precooling is performed to a temperature in the range of approximately $-190°$ F. to $-340°$ F.

9. The method of claim 5 wherein said pressurized argon or nitrogen-containing stream is at a pressure in the range of approximately 20 psig to 100 psig.

10. The method of claim 9 wherein said precooling is performed to a temperature in the range of approximately $-250°$ F. to $-340°$ F.

11. The method of claim 1 wherein the impinging aerosol is directed at said surface at an acute angle formed by said surface and the direction of the aerosol.

12. The method of claim 11 wherein said acute angle is approximately $45°$.

13. The method of claim 1 wherein after removal of said contaminating particles and/or film, said surface is warmed above the liquefaction temperature of argon or nitrogen at existing pressures.

14. The method of claim 1 wherein after removal of said contaminating particles and/or film, said surface is warmed above the liquefaction temperature of water at existing pressures.

15. The method of claim 1 wherein said surface is selected from the group consisting of gas distribution system components, microelectronic processing equipment and silicon wafers.

16. The method of claim 1 wherein particles smaller than 10,000 Angstroms are removed from said surface.

17. A method for removing contaminating particles and/or films from a particle and/or film-containing surface using an impinging aerosol stream of solid nitrogen particles comprising, precooling gaseous nitrogen to a temperature sufficient to condense out condensable impurities, separating the condensable impurities from the nitrogen, rapidly expanding the nitrogen from a pressure in the range of approximately 20 to 100 psig to a lower pressure condition, at a temperature so as to form solid particles of nitrogen by the cooling resulting from the expansion to produce said aerosol stream, and directing said aerosol stream at said surface to remove said contaminating particles and/or film.

* * * * *